United States Patent
Ternus et al.

(10) Patent No.: US 8,896,991 B2
(45) Date of Patent: Nov. 25, 2014

(54) HANDHELD COMPUTING DEVICE

(76) Inventors: John P. Ternus, Redwood City, CA (US); Stephen R. McClure, San Francisco, CA (US); Joshua D. Banko, Palo Alto, CA (US); Ming Yu, Saratoga, CA (US)

( * ) Notice: Subject to any disclaimer, the term of this patent is extended or adjusted under 35 U.S.C. 154(b) by 0 days.

(21) Appl. No.: 13/619,790

(22) Filed: Sep. 14, 2012

(65) Prior Publication Data
US 2013/0100607 A1    Apr. 25, 2013

Related U.S. Application Data

(63) Continuation of application No. 12/694,085, filed on Jan. 26, 2010, now Pat. No. 8,345,410.

(60) Provisional application No. 61/292,739, filed on Jan. 6, 2010.

(51) Int. Cl.
| H05K 5/03 | (2006.01) |
|---|---|
| G06F 1/16 | (2006.01) |
| H04M 1/02 | (2006.01) |
| H05K 1/02 | (2006.01) |
| H05K 1/11 | (2006.01) |
| H05K 1/14 | (2006.01) |

(52) U.S. Cl.
CPC ............ G06F 1/1633 (2013.01); G06F 1/1643 (2013.01); H05K 1/147 (2013.01); G06F 1/1626 (2013.01); H04M 1/0277 (2013.01); G06F 1/1613 (2013.01); H05K 1/0281 (2013.01); H04M 1/0266 (2013.01); G06F 1/1656 (2013.01); H04M 1/0252 (2013.01); H05K 1/118 (2013.01); H05K 5/03 (2013.01)
USPC ............... 361/679.02; 361/679.55; 455/575.1

(58) Field of Classification Search
CPC ... G06F 1/1626; G06F 1/1613; G06F 1/1656; G06F 1/1633; G06F 1/203; G06F 1/1698; G06F 1/1616; G06F 1/1637; G06F 1/1679; G06F 1/1643; H05K 5/03; H05K 7/14; H01Q 9/0407; H01Q 13/18; H01Q 1/1214; H01Q 1/2266; H01Q 5/0031; H04M 1/0266; H04M 1/0202; H04M 1/0249; H04M 2250/12
USPC ............ 361/679.01, 679.02, 679.55, 679.56, 361/679.57, 679, 58; 312/223.1–223.2; 455/575.1–575.4; 700/117
See application file for complete search history.

(56) References Cited

U.S. PATENT DOCUMENTS

| 6,552,261 B2 * | 4/2003 | Shlahtichman et al. ...... 174/384 |
| 7,203,533 B1 * | 4/2007 | Tischer ...................... 455/575.8 |

(Continued)

FOREIGN PATENT DOCUMENTS

| CN | 1989474 | 6/2007 |
| CN | 2938613 | 8/2007 |

(Continued)

OTHER PUBLICATIONS

Evaluation Report dated Aug. 30, 2012 Chinese App. No. ZL201120337251.0.

*Primary Examiner* — Anthony Haughton
*Assistant Examiner* — Ingrid Wright
(74) *Attorney, Agent, or Firm* — Womble Carlyle Sandridge & Rice LLP

(57) ABSTRACT

A portable computing device is disclosed. The portable computing device can take many forms such as a laptop computer, a tablet computer, and so on. The portable computing device can include at least a single piece housing. The single piece housing including a plurality of steps. The plurality of mounting steps is formed by at least removing a preselected amount of housing material at predetermined locations on the interior surface. At least some of the mounting steps are used to mount at least some of the plurality of internal operating components to the housing.

20 Claims, 12 Drawing Sheets

(56) References Cited

U.S. PATENT DOCUMENTS

| | | | |
|---|---|---|---|
| 7,522,943 B2* | 4/2009 | Hutchison | 455/575.1 |
| 7,535,702 B2* | 5/2009 | Deluga et al. | 361/679.55 |
| 7,630,199 B2* | 12/2009 | Shigenobu et al. | 361/679.55 |
| 8,238,087 B2 | 8/2012 | McClure et al. | |
| 8,345,410 B2 | 1/2013 | Ternus et al. | |
| 8,432,678 B2 | 4/2013 | McClure et al. | |
| 8,472,203 B2* | 6/2013 | Dabov et al. | 361/753 |
| 2001/0015005 A1 | 8/2001 | Chung et al. | |
| 2006/0177048 A1* | 8/2006 | Tsutaichi et al. | 379/433.13 |
| 2006/0285302 A1 | 12/2006 | Kim | |
| 2009/0067141 A1 | 3/2009 | Dabov et al. | |
| 2009/0257189 A1 | 10/2009 | Wang et al. | |
| 2011/0146298 A1* | 6/2011 | Reinhardt et al. | 60/796 |

FOREIGN PATENT DOCUMENTS

| | | |
|---|---|---|
| CN | 101458365 | 6/2009 |
| CN | 102117106 | 7/2011 |
| EP | 0090921 | 10/1983 |
| GB | 2490073 | 10/2012 |

* cited by examiner

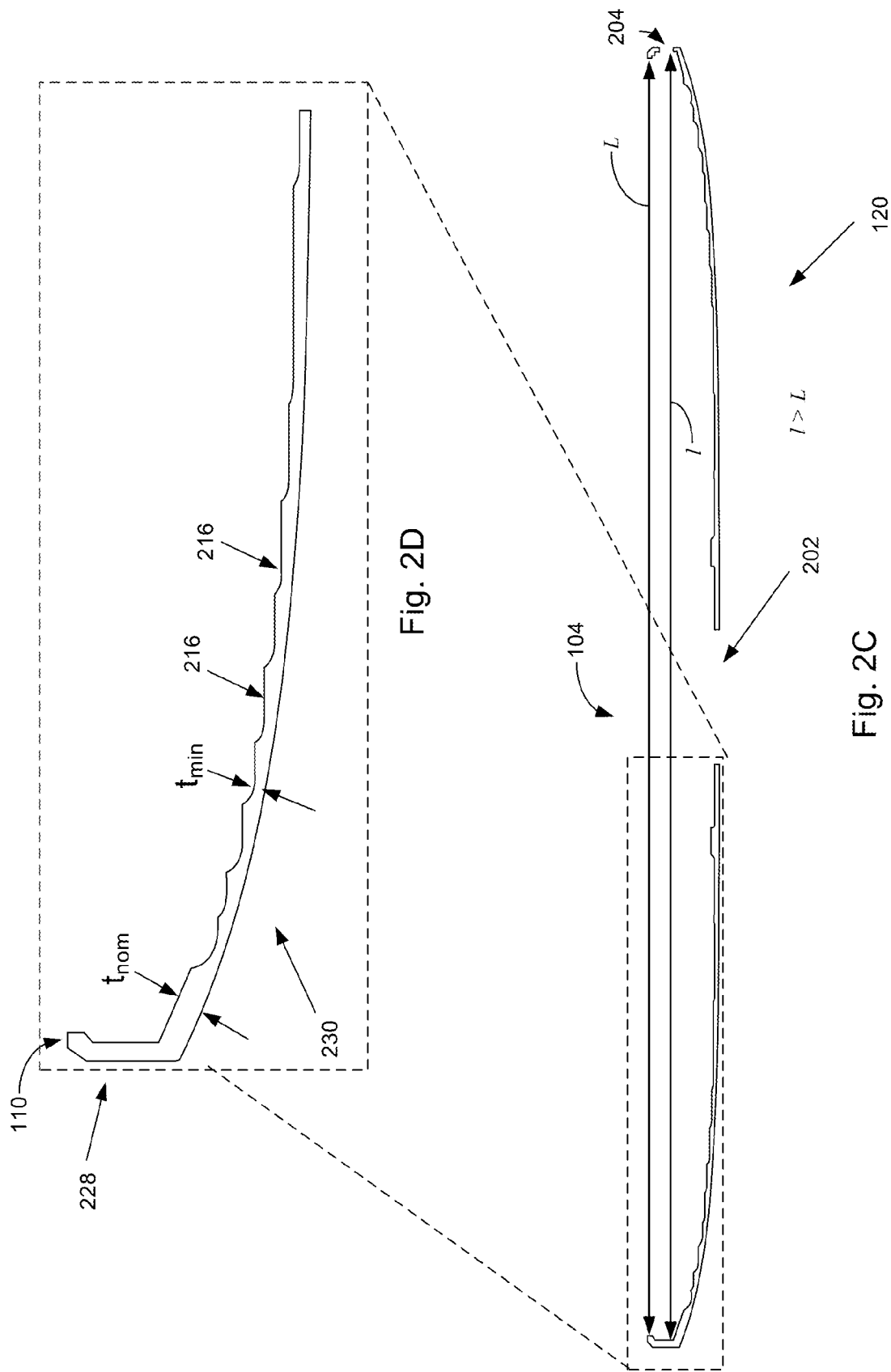

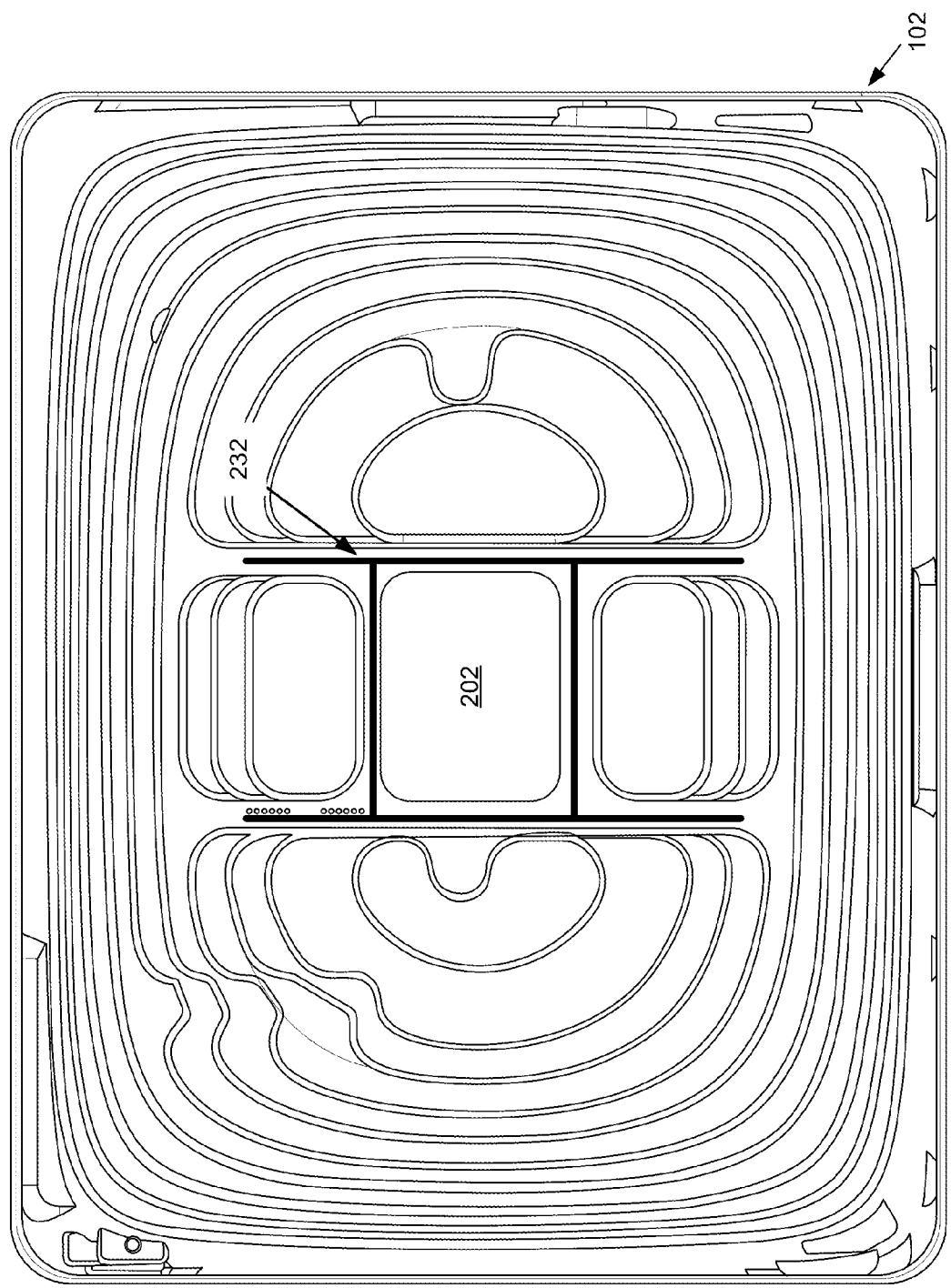

HANDHELD COMPUTING DEVICE

CROSS REFERENCE TO RELATED APPLICATIONS

This patent application is a continuation of and claims priority under 35 U.S.C. §120 to U.S. patent application Ser. No. 12/694,085, filed Jan. 26, 2010 entitled "HANDHELD COMPUTING DEVICE" by Ternus et al. that in turn claims priority under 35 U.S.C. §119(e) of U.S. Provisional Patent Application Ser. No. 61/292,739 entitled "HANDHELD COMPUTING DEVICE" by Ternus et al. filed Jan. 6, 2010 each of which are incorporated by reference in their entirety for all purposes.

This patent application is related to and incorporates by reference in their entirety the following co-pending patent applications:
(i) U.S. patent application Ser. No. 12/694,162 entitled "ASSEMBLY OF A DISPLAY MODULE" by Ternus et al. filed Jan. 26, 2010;
(ii) U.S. patent application Ser. No. 12/694,200 entitled "COMPONENT ASSEMBLY" by McClure et al. filed Jan. 26, 2010;
(iii) U.S. patent application Ser. No. 12/694,168 entitled "DISPLAY MODULE" by McClure et al. filed Jan. 26, 2010;
(iv) U.S. patent application Ser. No. 12/694,166 entitled "PRINTED CIRCUIT BOARD" by McClure et al. filed Jan. 26, 2010;
(v) U.S. patent application Ser. No. 13/117,016 entitled "PRINTED CIRCUIT BOARD" by McClure et al. filed May 26, 2011; and
(vi) U.S. patent application Ser. No. 12/694,083; and entitled "EDGE BREAK DETAILS AND PROCESSING" by Sweet et al. filed Jan. 26, 2010 that is, in turn, a continuation in part of and claims priority to U.S. patent application Ser. No. 12/580,934 entitled "METHOD AND APPARATUS FOR POLISHING A CURVED EDGE" by Lancaster et al. filed Oct. 16, 2009 that takes priority under 35 U.S.C. 119(e) to U.S. Provisional Patent Application Ser. No. 61/249,200 entitled "COMPLEX GEOGRAPHICAL EDGE POLISHING" by Johannessen filed Oct. 6, 2009.

BACKGROUND

1. Field of the Described Embodiments

The described embodiments relate generally to portable computing devices such as laptop computers, tablet computers, and the like. More particularly, enclosures of portable computing devices and methods of assembling portable computing devices are described.

2. Description of the Related Art

In recent years, portable computing devices such as laptops, PDAs, media players, cellular phones, etc., have become small, light and powerful. One factor contributing to this reduction in size can be attributed to the manufacturer's ability to fabricate various components of these devices in smaller and smaller sizes while in most cases increasing the power and or operating speed of such components. The trend of smaller, lighter and powerful presents a continuing design challenge in the design of some components of the portable computing devices.

One design challenge associated with the portable computing device is the design of the enclosures used to house the various internal components. This design challenge generally arises from a number conflicting design goals that includes the desirability of making the enclosure lighter and thinner, the desirability of making the enclosure stronger and making the enclosure more esthetically pleasing. The lighter enclosures, which typically use thinner plastic structures and fewer fasteners, tend to be more flexible and therefore they have a greater propensity to buckle and bow when used while the stronger and more rigid enclosures, which typically use thicker plastic structures and more fasteners, tend to be thicker and carry more weight. Unfortunately, however, the increased weight consistent with the more rugged enclosure can lead to user dissatisfaction whereas bowing of enclosures formed of lightweight material can result in damaging some of the internal components (such as printed circuit boards) of the portable device.

Furthermore, the enclosures are mechanical assemblies having multiple parts that are screwed, bolted, riveted, or otherwise fastened together at discrete points. These assembly techniques typically complicate the housing design and create aesthetic difficulties because of undesirable cracks, seams, gaps or breaks at the mating surfaces and fasteners located along the surfaces of the housing. For example, a mating line surrounding the entire enclosure is produced when using an upper and lower casing. Moreover, the various components and complicated processes used to manufacture the portable device can make assembly a time consuming and cumbersome process requiring, for example, a highly trained assembly operator working with special tools.

Another challenge is related to techniques for mounting structures within the portable computing devices. Conventionally, the structures have been laid over one of the casings (upper or lower) and attached to one of the casings with fasteners such as screws, bolts, rivets, etc. That is, the structures are positioned in a sandwich like manner in layers over the casing and thereafter fastened to the casing. This methodology suffers from the same drawbacks as mentioned above, i.e., assembly is a time consuming and cumbersome process.

In view of the foregoing, there is a need for improved component density and associated assembly techniques that reduce cost and improve outgoing quality. In addition, there is a need for improvements in the manner in which handheld devices are assembled such as improvements that enable structures to be quickly and easily installed within the enclosure. It is also desirable to minimize the Z stack height of the assembled components in order to reduce the overall thickness of the portable computing device and thereby improve the overall aesthetic look and feel of the product.

SUMMARY OF THE DESCRIBED EMBODIMENTS

A portable computing device is disclosed. The portable computing device can take many forms such as a laptop computer, a tablet computer, and so on. In one embodiment, the portable computing device can include at least a single piece housing having a front opening. The single piece housing can, in turn, include an integral bottom and side walls that cooperate to form a cavity in cooperation with the front opening. The bottom wall has a curved bottom surface and the side walls can have rectilinear edges arranged such that they form a flat side surface to form an undercut within the cavity. In addition, an edge of the side walls surrounds and defines the front opening. An interior surface of the bottom wall includes a plurality of steps suitable for mounting an internal component thereon. The portable computing device also includes a cover disposed within the front opening and attached to the seamless housing without a bezel.

In one aspect, the steps can be machined in one set up using computer numerical controlled (CNC) machine tools and associated techniques. In addition, any sharp edges can be rounded to a more benign shape thereby reducing any possibility of damaging internal components.

In another embodiment, a system is described. The system includes at least a housing used to support a plurality of internal operating components, a plurality of mounting steps formed on a interior surface of the housing. The plurality of mounting steps are formed by at least removing a preselected amount of housing material at predetermined locations on the interior surface. At least some of the mounting steps are used to mount at least some of the plurality of internal operating components to the housing. An integrated beam system can be integrally formed in the housing and be used to provide support for the housing by distributing a force applied at a point in the housing evenly about the housing. The integrated beam system can be formed by removing an amount of housing material that is less than the preselected amount used to form the mounting steps at predetermined locations on the interior surface of the housing.

In another embodiment, a method of forming a plurality of steps within an enclosure, the enclosure used to support operational components for a portable computing device is disclosed. The method can be performed by carrying out at least the following operations. Providing a housing having a nominal wall thickness suitable for enclosing and supporting the operational components of the portable computing device, determining a minimum wall thickness of the housing, determining a step height corresponding to each of the plurality of steps, determining a step pattern, and removing an amount of housing material corresponding to the step height and the step pattern.

In one aspect, an integrated beam system can be formed by removing less than the determined amounts of material from an inner surface of the housing. The integrated beam system can be part of the housing and be used to provide support for the housing by, in part, distributing a force applied to the portable computing device. In this way, by distributing the applied force, the risk of deforming or damaging the housing can be substantially reduced.

In yet another embodiment, a single piece housing having a front opening, the single piece housing wherein most of the housing is formed of a radio opaque material is disclosed. In the described embodiment, the single piece housing includes at least an integral bottom and side walls that cooperate to form a cavity in cooperation with a front opening, the bottom wall having a curved bottom surface, the side walls having rectilinear edges arranged such that they form a flat side surface an undercut within the cavity, an edge of the side walls surrounding and defining the front opening, and a cover disposed within the front opening and attached to the seamless housing without a bezel. At least a portion of the housing is removed and replaced with a portion formed of radio transparent material integrated with the remainder of the single piece housing, the radio transparent portion is conforms to the shape of the removed portion of the housing.

Computer readable medium for tangibly storing a computer program used by a processor for forming a plurality of steps within an enclosure is disclosed. In the described embodiment, the enclosure is used to support operational components for a portable computing device. The computer readable medium includes at least computer code for providing a housing having a nominal wall thickness suitable for enclosing and supporting the operational components of the portable computing device, computer code for determining a minimum wall thickness of the housing, computer code for determining a step height corresponding to each of the plurality of steps, computer code for determining a step pattern, and computer code for removing an amount of housing material corresponding to the step height and the step pattern.

BRIEF DESCRIPTION OF THE DRAWINGS

The embodiments will be readily understood by the following detailed description in conjunction with the accompanying drawings, wherein like reference numerals designate like structural elements, and in which:

FIGS. 2C and 2D show representative cross sectional view of section A-A of the housing shown in FIG. 2A.

FIG. 2E shows an interior of housing shown in FIG. 2A illustrating an integrated beam structure.

DESCRIBED EMBODIMENTS

Figure 1A:
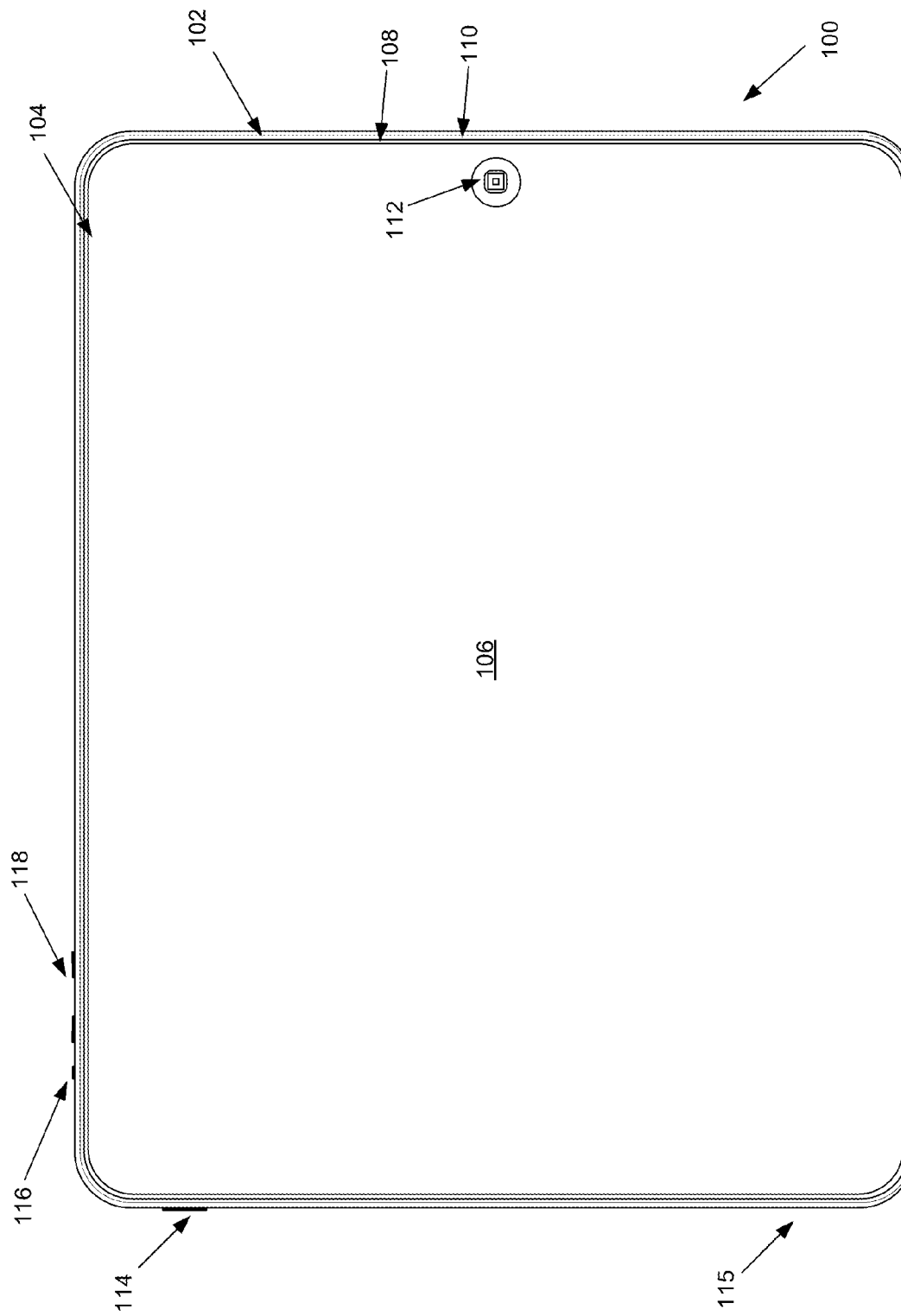
FIG. 1A shows a top view of a portable computing device in accordance with the described embodiments.

In the following paper, numerous specific details are set forth to provide a thorough understanding of the concepts underlying the described embodiments. It will be apparent, however, to one skilled in the art that the described embodiments may be practiced without some or all of these specific details. In other instances, well known process steps have not been described in detail in order to avoid unnecessarily obscuring the underlying concepts.

This paper discusses an aesthetically pleasing portable computing device that is easy to carry with one hand and operate with the other. The portable computing device can be formed of a single piece seamless housing and an aesthetically pleasing protective top layer that can be formed of any of a number of durable and strong yet transparent materials such as highly polished glass or plastic. For the remainder of this discussion, however, the protective top layer can take the form of highly polished cover glass without any loss in generality. Furthermore, the uniformity of the appearance of the portable computing device can be enhanced since (unlike conventional portable computing devices) the cover glass can be mounted to the single piece seamless housing without the use of a bezel. This simplicity of design can accrue many advantages to the portable computing device besides those related to aesthetic look and feel. For example, fewer components and less time and effort can be required for assembly of the portable computing device and the absence of seams in the single piece housing can provide good protection against environmental contamination of internal components. Moreover, the ability of the portable computing device to successfully withstand applied loads (such as from day to day use) as well as those from less frequent but potentially more damaging events such as being dropped can be substantially improved over conventional portable computing devices.

In the described embodiments, the single piece seamless housing can be formed from plastic or metal. In the case where the single piece seamless housing is formed of metal, the metal can take the form of a single sheet (such as aluminum). The single sheet of metal can be formed into a shape appropriate for housing various internal components as well as providing various openings into which switches, connectors, displays, and so on can be accommodated. The single piece seamless housing can be forged, molded, or otherwise processed into a desired shape. The shape of the housing can be asymmetric in that an upper portion of the housing can formed to have a substantially different shape than that exhibited by a lower portion of the housing. For example, the upper portion of the housing can have surfaces that meet at distinct angles forming well defined boundary whereas the lower portion can be formed to have a surface with a spline shape. The transition zone between the upper portion having distinct edges and the lower, spline shaped portion can take the form of an edge having a rounded shape providing both a natural change from the upper portion of the housing (i.e., the area of distinct edges) and the smoother surface presented by the lower portion of the housing. It should also be noted that in addition to providing a more aesthetically pleasing transition, the rounded shape of the edge in the transition zone can provide a more comfortable feel when being held in a user's hand either during use or merely being carried about. One of the advantages to using metal for the housing is ability of metal to provide good electrical grounding for any internal components requiring a good ground plane. For example, performance of a built in RF antenna can be substantially improved when a good ground plane is provided. Moreover, a good ground plane can be used to help mitigate the deleterious effects caused by, for example, of electromagnetic interference (EMI) and/or electrostatic discharge (ESD). However, if an RF antenna is present within the housing, then at least a portion of the housing (if metal) is given over to a radio transparent portion.

It should be noted that throughout the following discussion, the term "CNC" is used. The abbreviation CNC stands for computer numerical control and refers specifically to a computer controller that reads computer instructions and drives a machine tool (a powered mechanical device typically used to fabricate components by the selective removal of material). It should be noted however, that any appropriate machining operation can be used to implement the described embodiments and is not strictly limited to those practices associated with CNC.

These and other embodiments are discussed below with reference to FIGS. 1-8. However, those skilled in the art will readily appreciate that the detailed description given herein with respect to these figures is for explanatory purposes only and should not be construed as limiting.

FIG. 1A illustrates a specific embodiment of portable computing device 100. More specifically, FIG. 1A shows a full top view of fully assembled portable computing device 100. Portable computing device 100 can process data and more particularly media data such as audio, video, images, etc. By way of example, portable computing device 100 can generally correspond to a device that can perform as a music player, game player, video player, personal digital assistant (PDA), tablet computer and/or the like. With regards to being handheld, portable computing device 100 can be held in one hand by a user while being operated by the user's other hand (i.e., no reference surface such as a desktop is needed). For example, the user can hold portable computing device 100 in one hand and operate portable computing device 100 with the other hand by, for example, operating a volume switch, a hold switch, or by providing inputs to a touch sensitive surface such as a display or pad.

Portable computing device 100 can include single piece seamless housing 102 that can be formed of any number of materials such as plastic or metal which can be forged, molded, or otherwise processed into a desired shape. In those cases where portable computing device 100 has a metal housing and incorporates RF based functionality, it may be advantageous to provide at least a portion of housing 102 in the form of radio (or RF) transparent materials such as ceramic, or plastic. In any case, housing 102 can be configured to at least partially enclose any suitable number of internal components associated with the portable computing device 100. For example, housing 102 can enclose and support internally various structural and electrical components (including integrated circuit chips and other circuitry) to provide computing operations for portable computing device. The integrated circuits can take the form of chips, chip sets, modules any of which can be surface mounted to a printed circuit board, or PCB, or other support structure. For example, a main logic board (MLB) can have integrated circuits mounted thereon that can include at least a microprocessor, semi-conductor (such as FLASH) memory, various support circuits and so on.

Housing 102 can include opening 104 for placing internal components and may be sized to accommodate a display assembly or system suitable for providing a user with at least visual content as for example via a display. In some cases, the display system can include touch sensitive capabilities providing the user with the ability to provide tactile inputs to portable computing device 100 using touch inputs. The display system can be formed of a number of layers including a topmost layer being a transparent protective layer 106 formed of polycarbonate or other appropriate plastic or highly polished glass. Using highly polished glass, protective layer 106 can take the form of cover glass 106 substantially filling opening 104. Seal 108 can be used to form a gasket between cover glass 106 and housing 102. Seal 108 can be formed of a resilient material such as a plastic along the lines of thermoplastic urethane or TPU. In this way, seal 108 can provide protection against environmental contaminants from entering the interior of portable computing device 100. Racetrack 110 can be defined as the uppermost portion of the housing 102 that surrounds cover glass layer 106. In order to maintain the desired aesthetic look and feel of portable computing device 100, it is desirable that any offsets between the housing 102 and cover glass 106 be minimized by centering racetrack 110.

Although not shown, the display panel underlying cover glass 106 can be used to display images using any suitable display technology, such as LCD, LED, OLED, electronic or e-inks, and so on. Display assembly may be placed and secured within the cavity using a variety of mechanisms. In one embodiment, the display system is snapped into the cavity. It may be placed flush with the adjacent portion of the housing. In this way, the display can present visual content that can include video, still images, as well as icons such as graphical user interface (GUI) that can provide information the user (e.g., text, objects, graphics) as well as receive user provided inputs. In some cases, displayed icons can be moved by a user to a more convenient location on the display. For example, GUI can be moved by the user manually dragging GUI from one location to a more convenient location. The display can also provide a user with tactile feedback provided by a number of haptic actuators usually, but not always, arranged in an array of haptic actuators incorporated into the display. In this way, the haptic actuators can provide the user with tactile feedback.

In some embodiments, a display mask (not shown) can be applied to, or incorporated within or under cover glass 106. The display mask can be used to accent an unmasked portion of the display used to present visual content. The display mask can be used to make less obvious home button 112 used to provide a specific input such as change display mode, for example to portable computing device 100. The display mask can render home button 112 less obvious by, for example, being closer in tone or color to home button 112. For example, if home button 112 is formed of a material that is somewhat darker (such as gray or black) than cover glass 106, then using a similarly colored display mask can reduce the visual impact of home button 112 when compared with the unmasked portion of cover glass 106. In this way, the visual impact of home button 112 can be reduced by being integrated into the overall look of the display mask. Furthermore, the display mask can provide a natural mechanism for directing the attention of a viewer to the unmasked area of the display used to present visual content.

Portable computing device 100 can include a number of mechanical controls for controlling or otherwise modifying certain functions of portable computing device 100. For example, power switch 114 can be used to manually power on or power off portable computing device 100. Mute button 116 can be used to mute any audio output provided by portable computing device 100 whereas volume switch 118 can be used to increase/decrease volume of the audio output by portable computing device 100. It should be noted that each of the above described input mechanisms are typically disposed through an opening in housing 102 such that they can couple to internal components. In some embodiments, portable computing device 100 can include a camera module configured to provide still or video images. The placement may be widely varied and may include one or more locations including for example front and back of the device, i.e., one through the back housing, the other through the display window.

Portable computing device 100 can include a mechanism for wireless communications, as either a transceiver type device or receiver only, such as a radio, portable computing device 100 can include an antenna that can be disposed internal to a radio transparent portion of housing 102. In some embodiments, an antenna can be incorporated into seal 108 or cover glass 106. In other embodiments, a portion of housing 102 can be replaced with radio transparent material in the form of an antenna window described in more detail below. The radio transparent material can include, for example, plastic, ceramic, and so on. The wireless communications can be based on many different wireless protocols including for example 3G, 2G, Bluetooth, RF, 802.11, FM, AM, and so on. Any number of antennas may be used, which can use a single window or multiple windows depending on the needs of the system. In one embodiment, the system can include at least first and second antenna windows built into the housing (upper and logo).

Figure 1B:
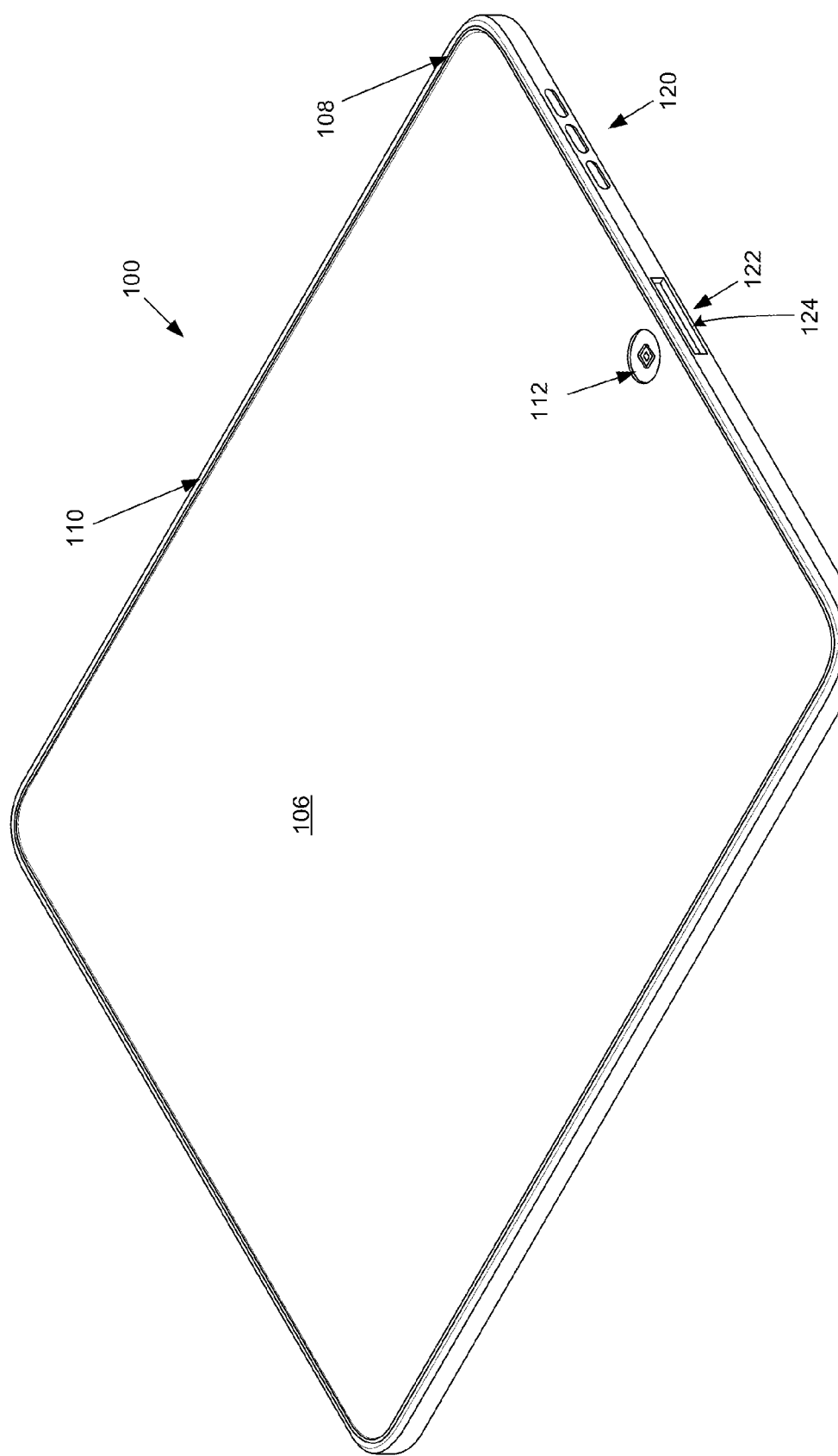
FIG. 1B shows a perspective top view of a portable computing device in accordance with the described embodiments.

FIG. 1B shows a perspective top view of portable computing device 100 in accordance with the described embodiments. As shown in FIG. 1B, portable computing device 100 can include one or more speakers 120 used to output audible sound. Portable computing device 100 can also include one or more connectors for transferring data and/or power to and from portable computing device 100. For example, portable computing device 100 can include multiple data ports, one for each configuration of portrait mode and landscape mode. However, the currently described embodiment includes single data port 122 that can be formed of connector assembly 124 accommodated within an opening formed along a first side of housing 102. In this way, portable computing device 100 can use data port 122 to communicate with external devices when portable computing device 100 is mounted in docking station. It should be noted that in some cases, portable computing device 100 can include an orientation sensor or an accelerometer that can sense the orientation or movement of portable computing device 100. The sensor can then provide an appropriate signal which will then cause portable computing device 100 to present visual content in an appropriate orientation.

Connector assembly 124 can be any size deemed appropriate such as, for example, a 30 pin connector. In some cases, the connector assembly 124 can serve as both a data and power port thus obviating the need for a separate power connector. Connector assembly 124 can be widely varied. In one embodiment, connector assembly 124 can take the form of a peripheral bus connector, such as a USB or FIREWIRE connector. These types of connectors include both power and data functionality, thereby allowing both power delivery and data communications to occur between the portable computing device 100 and the host device when the portable computing device 100 is connected to the host device. In some cases, the host device can provide power to the media portable computing device 100 that can be used to operate the portable computing device 100 and/or charge a battery included therein concurrently with the operating.

Figure 2A:
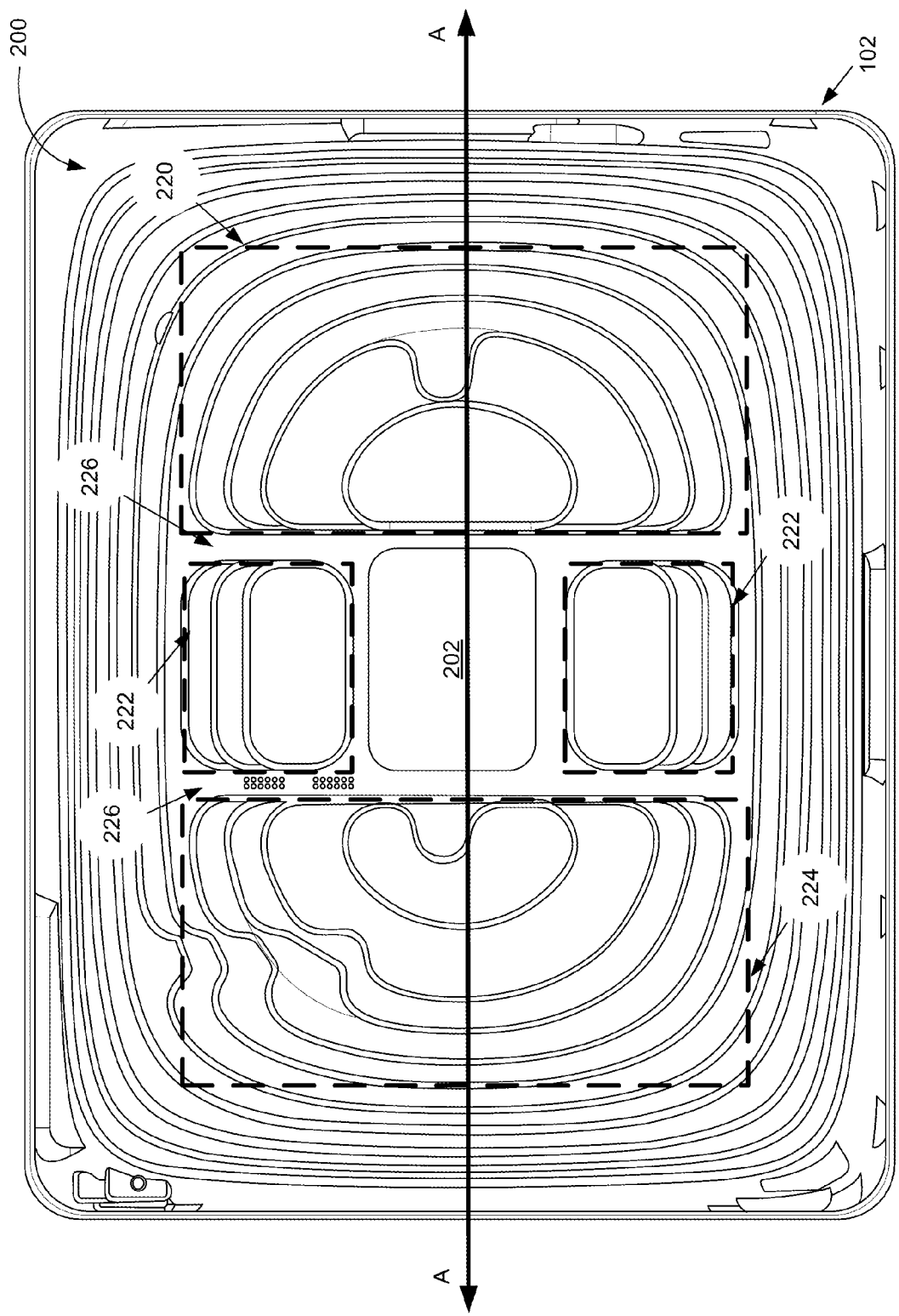
FIG. 2A shows a full interior view of a housing suitable for enclosing operational components of the portable computing device shown in FIGS. 1A and 1B.
Figure 2B:
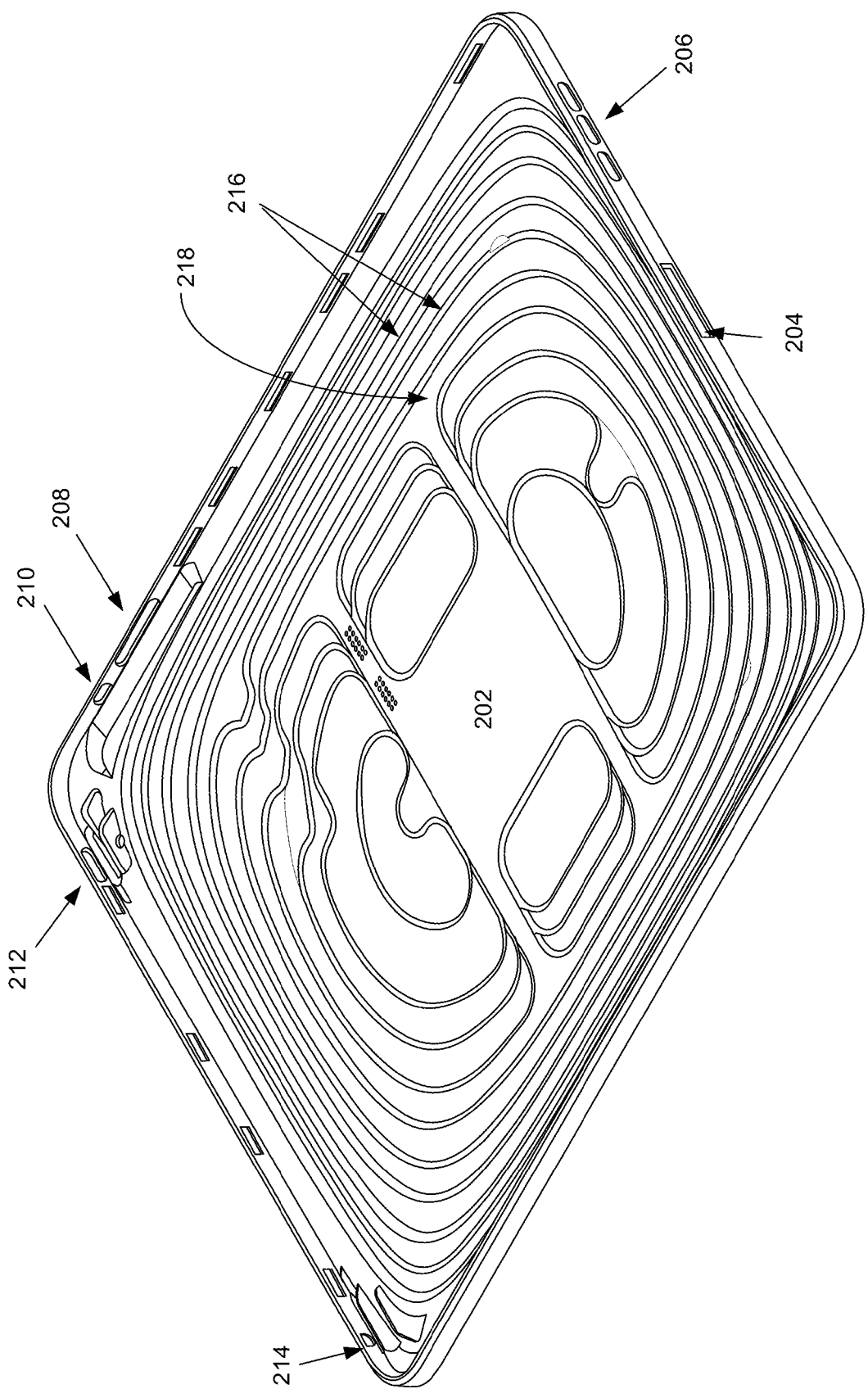
FIG. 2B shows a perspective interior view of a housing suitable for enclosing operational components of the portable computing device shown in FIGS. 1A and 1B.

FIGS. 2A and 2B present a representative interior view of cavity (also referred to as lumen) 200 of single piece seamless housing 102 used to enclose various internal components of the portable computing device 100 shown in FIGS. 1A and 1B. In the described embodiment, single piece seamless housing 102 can be formed from a single sheet of metal (such as aluminum) and formed into an appropriate shape using, for example, using conventional collapsible core metal forming techniques well known to those skilled in the art. Housing 102 can include a number of features used to facilitate the installation of internal components used in the assembly of portable computing device 100. For example, opening 202 can be formed in housing 102 suitably sized and located for an RF antenna. In the case where opening 202 is used for placing an RF antenna, opening 202 can support an RF antenna support assembly formed of at least some radio transparent material. In this way, the RF antenna support assembly can facilitate unimpeded transmission and reception of RF energy in support of any number of wireless protocols such as WiFi, Blue Tooth, and so on. It should be noted the ability to provide unfettered RF functionality is especially important when housing 102 is formed of radio opaque materials such as most metals.

In order to accommodate various interfaces (dock, audio jack, volume, power, mute, and so on), openings of various sizes can be created in the housing 102. For example, opening 204 can be used to support data port 122, openings 206 can be used to provide support for speakers 120; opening 208 can provide support for volume switch 118 and opening 210 for mute button 116. Furthermore, opening 212 can be used to provide support for power switch 114 and opening 214 for an audio jack. It should be noted that any number of approaches can be used to create these openings and make the opening trim appear to be thicker than the thickness (about 1.5 mm) of the sheet metal used to create housing 102. Creating these openings in the housing 102, however, can result in long and thin webs of metal that can deform from the impact of a drop event or cause housing 102 to exhibit unacceptable flexing under torsion. A particular reinforcing technique is described below.

A plurality of steps 216 can be formed in bottom surface 218 of housing 102. Steps 216 can be used to provide a support platform for mounting various internal components onto bottom surface 218 of housing 102. In the described embodiment, steps 216 can be formed by removing a predetermined amount of housing material (such as aluminum) using conventional machining techniques. Typically, each of the steps can have rounded edges in order to protect internal components that may come in contact. As is apparent in FIGS. 2A and 2B, steps 216 can also be formed into various patterns, such as pattern 220, 222 and pattern 224. Far from being merely aesthetic in nature, the various patterns can be very useful. For example, the various patterns can be used to accommodate mounting structures used to support internal components, such as for example a battery mount. In some cases, pattern 226 can take the form of an integrated beam structure described in more detail below that provides for a more even distribution of loads applied to housing 102. Moreover, in addition to providing structural support and aiding in resisting deformation, the housing material removed in the formation of the plurality of steps 216 can help to substantially reduce the overall weight of housing 102.

FIGS. 2C and 2D show shows a cross sectional view of housing 102 taken along line A-A of FIGS. 2A and 2B. In particular, FIG. 2C shows the nature of the undercut geometry of housing 102 illustrating more clearly how linear dimensions (length L, for example) of opening 104 into which the operational components can be inserted during assembly is smaller than the linear dimensions (length l, for example) of the body of the housing 102. Moreover, the curvature of housing 102 can be asymmetric in that upper portion 228 of housing 102 can be formed to have distinct edges whereas lower portion 230 can be formed to have spline shape. This asymmetry aids in the tactile sensation presented by portable computing device 100 in part because it provides a better fit to the user's hand.

In any case, housing 102 can have a nominal wall thickness $t_{nom}$ (that can be on the order of about 1.5 mm). Upper portion 228 can be formed in such a way as to have a substantially uniform average wall thickness close to nominal wall thickness $t_{nom}$. Since interior surface 218 of lower portion 230 substantially conforms to the spline shape of exterior surface of housing 102, mounting internal components onto interior surface 218 can be difficult or at best sub-optimal. For example, in order to securely place an internal component onto interior surface 218, any mounting structure used to mount the internal component to internal surface 218 would have to be specially machined to fit the curvature of interior surface 218. This special machining would require special tooling and add extra costs to manufacture as well as adding complexity and time required for assembly.

Therefore, in order provide a more suitably shaped interior surface upon which to mount internal components (as well as to reduce the weight of housing 102), interior surface 218 of housing 102 can be sculpted (using CNC machining techniques, for example) to any appropriate shape. Interior surface 218 can be sculpted to include plurality of mounting steps 216 that can resemble in form a terrace. Firstly, however, a determination can be made of a minimum thickness $t_{min}$ for housing 102 that is consistent with both good structural integrity and a desired weight reduction. For example, in the case where housing 102 is formed of aluminum having nominal thickness $t_{nom}$ of about 1.5 mm, it has been determined that minimum thickness $t_{min}$ of about 0.6 mm results in an average step height "h" of about 0.5 mm resulting in an average weight reduction of about 25%. Using these settings, interior surface 218 of housing 102 can be machined in one machine set up to include a suitable number of steps each having step height h creating various terracing patterns well suited for both reducing the overall weight of housing 102 but also providing suitable mounting platforms for mounting various internal components.

As shown in FIG. 2E, portions of interior surface 218 can be maintained at a thickness that is substantially the same as nominal thickness $t_{nom}$. For example, in order to distribute any stresses applied to housing 102 more evenly, integrated beam system 232 (which in FIG. 2E resembles the letter "H") can be created simply by not machining those portions of housing 102 consistent with the desired location of integrated beam system 232. In some cases, however, integrated beam system 232 can be created by simply removing less material from housing 102 in those locations corresponding to integrated beam system 232 such that thickness t corresponding to integrated beam system 232 is $t_{nom} > t > t_{min}$. In this way, beam structure 232 can more evenly distribute applied loads across a larger region of housing 102 thereby minimizing the likelihood of buckling or deformation.

Unlike the assembly of conventional portable electronic devices where components are assembled in a top-down manner (i.e., the components are inserted into the housing before the bezel is snapped on), the undercut geometry of housing 102 requires that all components fit within the dimensions (L, W) of opening 104. Moreover, the assembly of portable electronic device 100 can be carried out in a bottom-up manner. In order to facilitate the bottom-up assembly of portable electronic device 100 and to minimize any offsets between the polished top glass layer and an uppermost portion of the housing (racetrack 110), various techniques, apparatus and systems can be used that minimize stack (i.e., z direction) tolerance.

Figure 3:
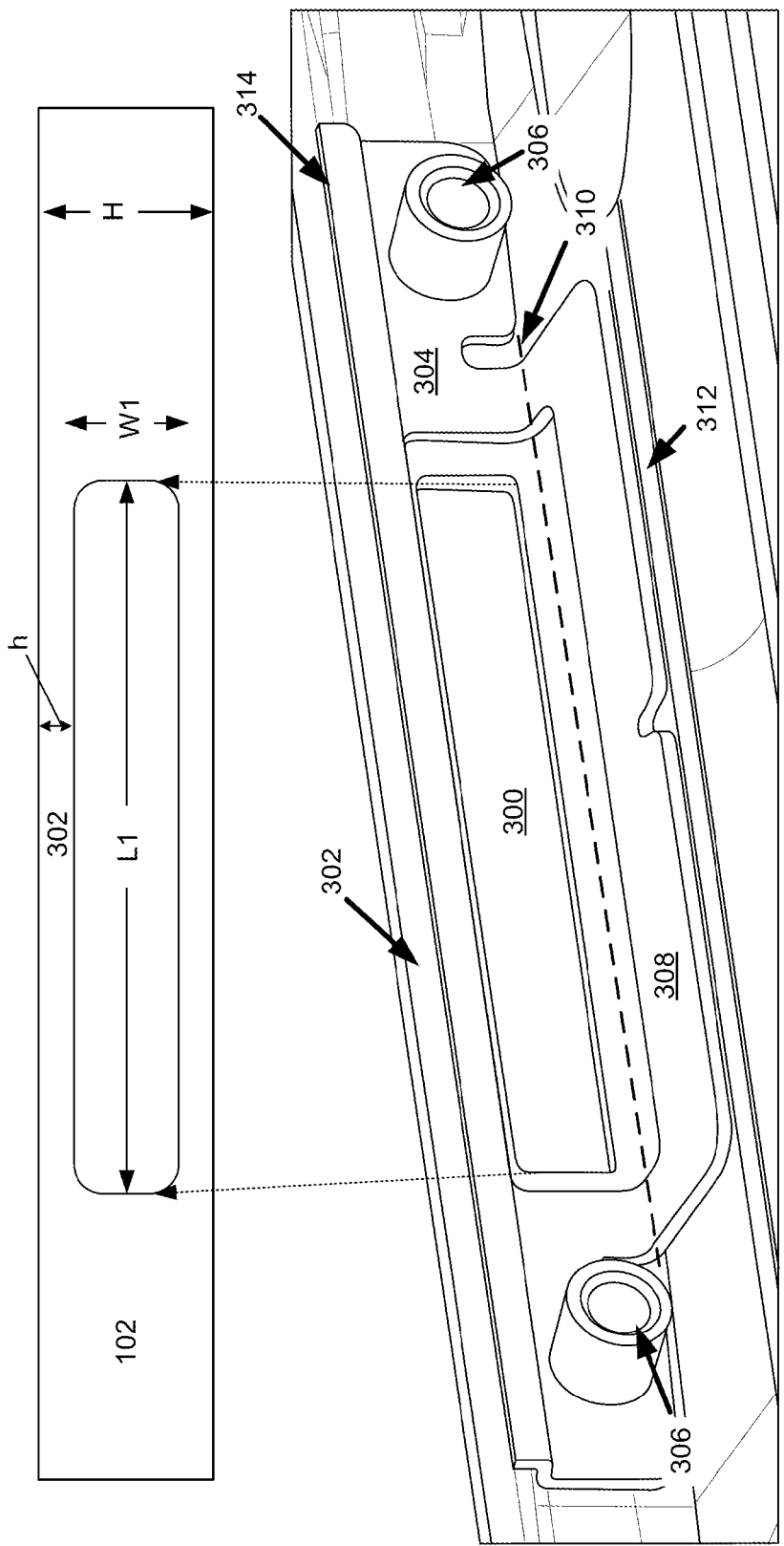
FIG. 3 shows representative opening formed in housing used to accommodate a connector assembly.

In order to accommodate connector assembly 124, an opening must be formed in housing 102. In the case where connector assembly 124 has a sizeable number of pins (such as 30), the size of the opening required to accommodate connector 124 can be quite large relative to housing 102 thereby adversely affecting the integrity of housing 102. For example, FIG. 3 shows representative opening 300 formed in housing 102 used to accommodate connector assembly 124. In this example, connector assembly 124 can include a number of connectors arranged longitudinally such that opening 300 must have length L1 substantially greater the width W1 creating region 302 in housing 102. In the described embodiment, region 302 can have height h that is substantially less than the nominal height H of the first wall of housing 102 resulting in region 302 having potentially unsatisfactory resistance to buckling especially in a drop event.

In order to improve buckling resistance of region 302, support bracket 304 can be used to reinforce region 302 as well as provide a mounting feature for connector assembly 124. In the described embodiment, support bracket 304 can be formed of strong resilient material such as steel. Support bracket 304 can include bosses 306 used to accept fasteners suitable for attaching connector assembly 124 to support bracket 304. Portion 308 of support bracket 304 can be folded, bent, or otherwise formed along folding line 310 that can correspond to ledge 312 formed in a bottom portion of housing 102. In this way, portion 308 can be attached directly to ledge 312 using, for example, adhesives along the lines of epoxy, or by being welded into place. In addition to attaching portion 308 to ledge 312, support bracket 304 can be attached to the first wall of housing 102 using portion 314. In the described embodiment, portion 314 can be shaped (such as an L shape) in order to provide additional support for region 302 shown in more detail below.

Figure 4:
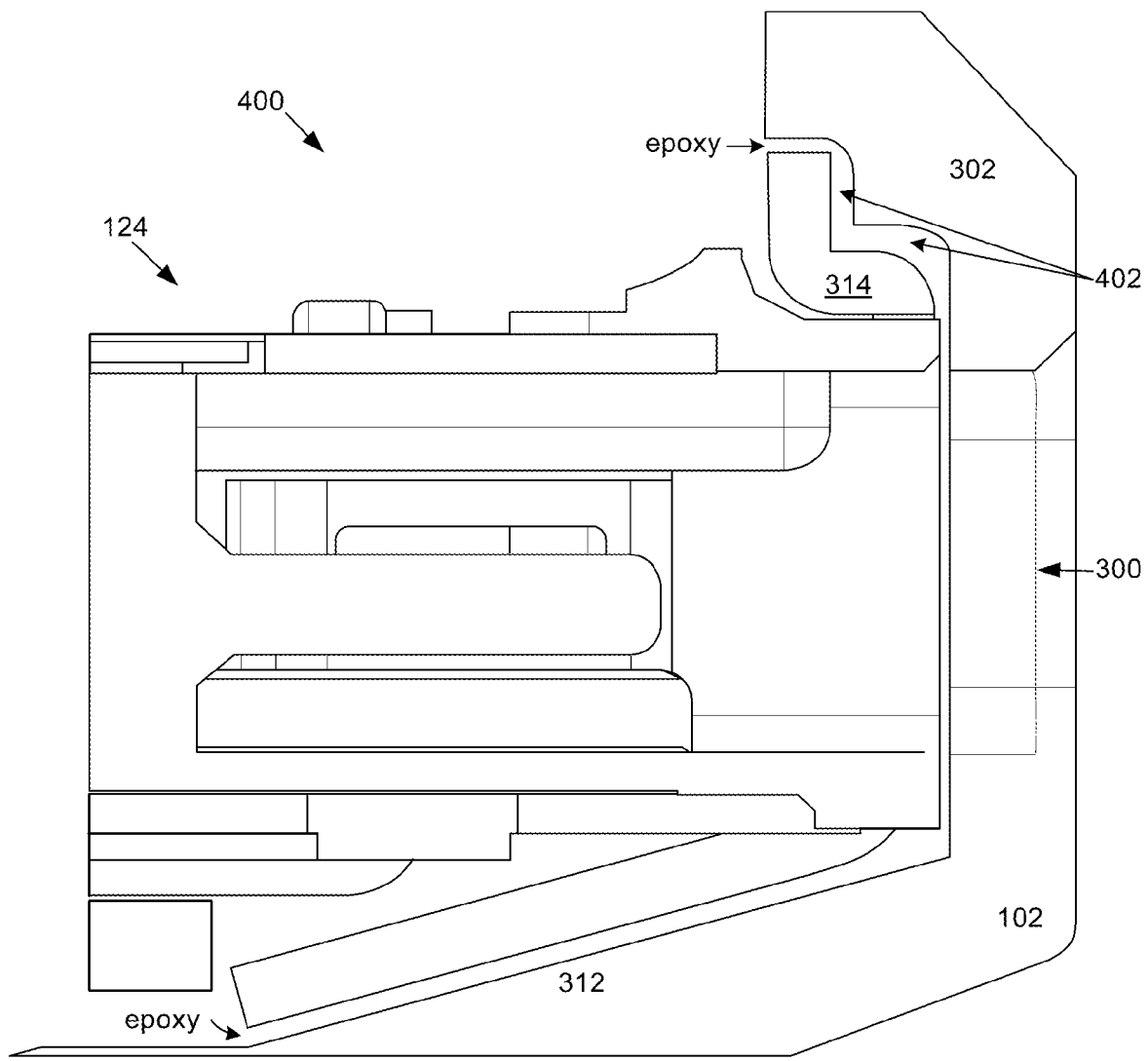
FIG. 4 shows representative cross sectional view of connector assembly and support bracket in accordance with the described embodiments.

FIG. 4 shows representative cross sectional view 400 of connector assembly 124 and support bracket 304 (in particular regions 308 and 314) in accordance with the described embodiments. In order to attach (L shaped) region 314 of support bracket 304 to housing 102 (in particular region 302) amount 402 of housing material commensurate with the size of and shape of region 314 can be removed from an interior surface of housing 102 in the area of region 302. Epoxy (or other suitable bonding agent) can then be used to attach region 314 to the newly exposed interior surface of housing 102. Therefore, even though an amount of housing material is removed, the replacement by region 314 of support bracket 304 substantially increases the strength of region 302.

Figure 5:
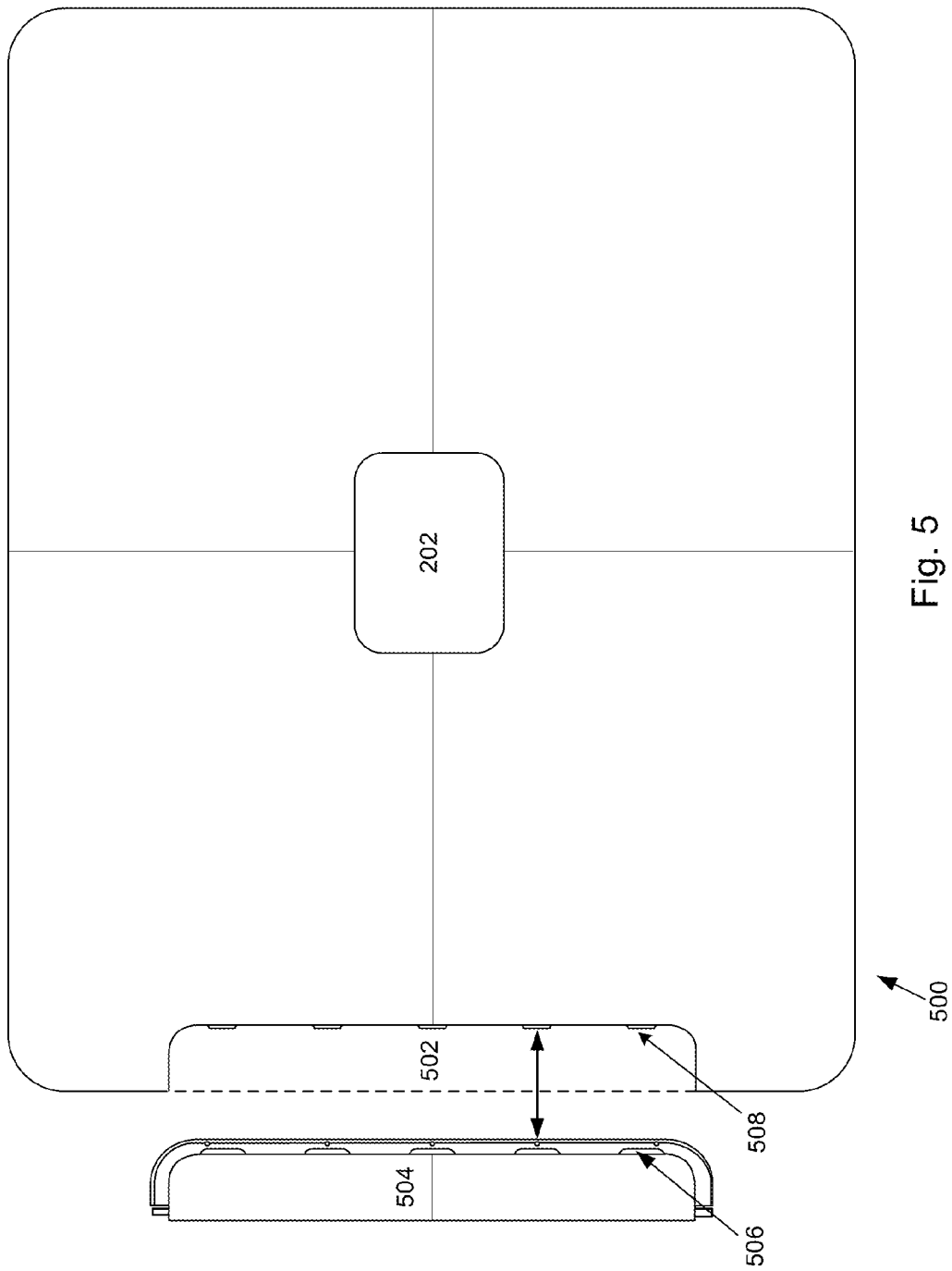
FIGS. 5-7 show various configurations and method of assembling a radio transparent antenna window in accordance with the described embodiments.

Since it is contemplated that portable computing device 100 can be configured to access wireless networks using any number of wireless protocols, those embodiments of housing 102 formed of radio opaque material can be adapted for use with RF compliant portable computing devices. For example, in one embodiment, housing 102 can have portions removed in order to reduce the likelihood that the radio opacity of housing 102 will interfere with wireless operations. Accordingly, FIG. 5 shows housing 500 formed of radio opaque material such as metal configured for use with portable computing device 100 having wireless (RF) based functionality. In particular, housing 500 can be formed in much the same way as housing 102 with the exception that radio opaque portion 502 can be removed and replaced with radio transparent portion 504 (also referred to as an antenna window). In the described embodiment, antenna window 504 can be formed of plastic, ceramic materials, or any material of suitable strength having the appropriate level of radio transparency. Therefore, it is contemplated that antenna window 504 can be placed in proximity to an internal RF antenna in order to minimize the interference of housing 102 and to help to maximize the efficiency of the RF antenna. For both aesthetic reasons and the maintenance of structural integrity of housing 500, antenna window 504 can be made to substantially conform to the shape of housing 500. Therefore, antenna window 504 can have a shape that conforms to the shape of housing 500. In this way, antenna window 504 can have an upper portion that has a similar shape as upper portion 228 and a lower portion similarly shaped to lower portion 230 of housing 102.

Figure 6:
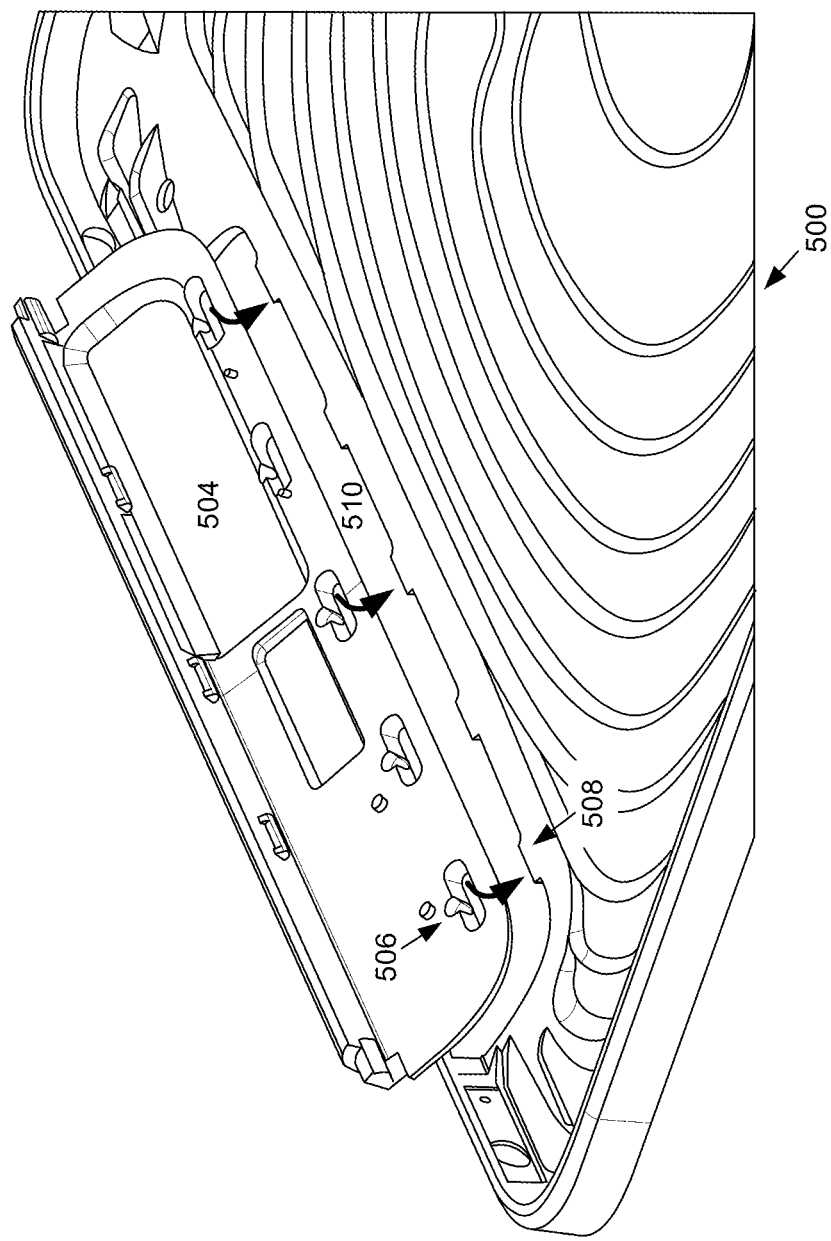
Figure 7:
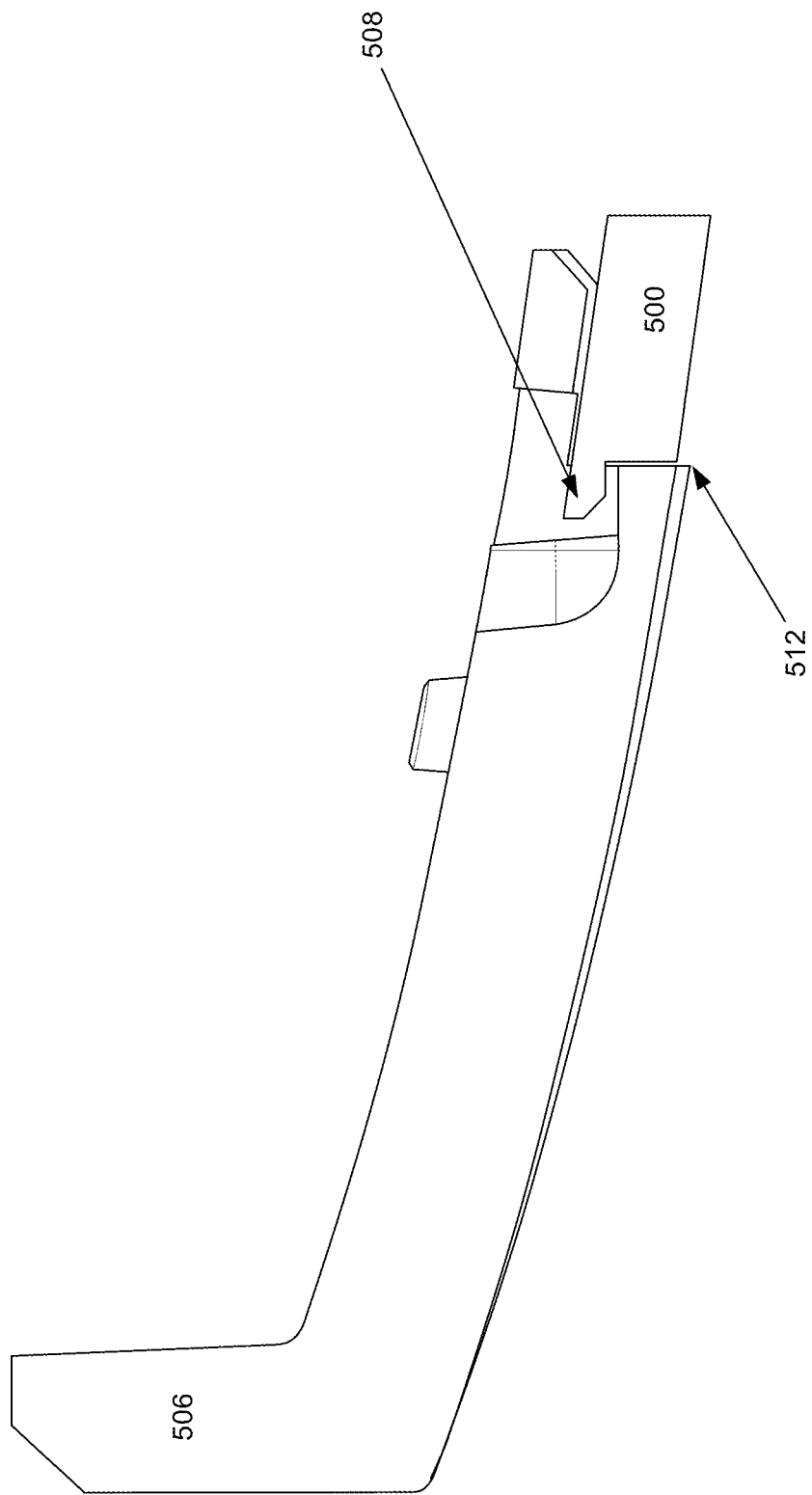

In order to assure easy assembly and a good structural bond, antenna window 504 can be formed to include plurality of grooves 506 arranged to accept a corresponding one of a plurality of castellation 508 formed on housing 500. For example, as shown in FIG. 6, antenna window 504 can placed within opening 510 and in a diving motion, placed in proximity to housing 500 such that castellation 508 can be inserted within corresponding groove 506. Once each of the castellation are inserted into an appropriate one of the grooves, epoxy (or other appropriate adhesive) placed within or inserted into each groove as shown in FIG. 7 to permanently attach antenna window 504 to housing 500. It should be noted that gap 512 can remain to account for the differences in coefficients of thermal expansion of housing 500 and antenna window 506.

Figure 8:
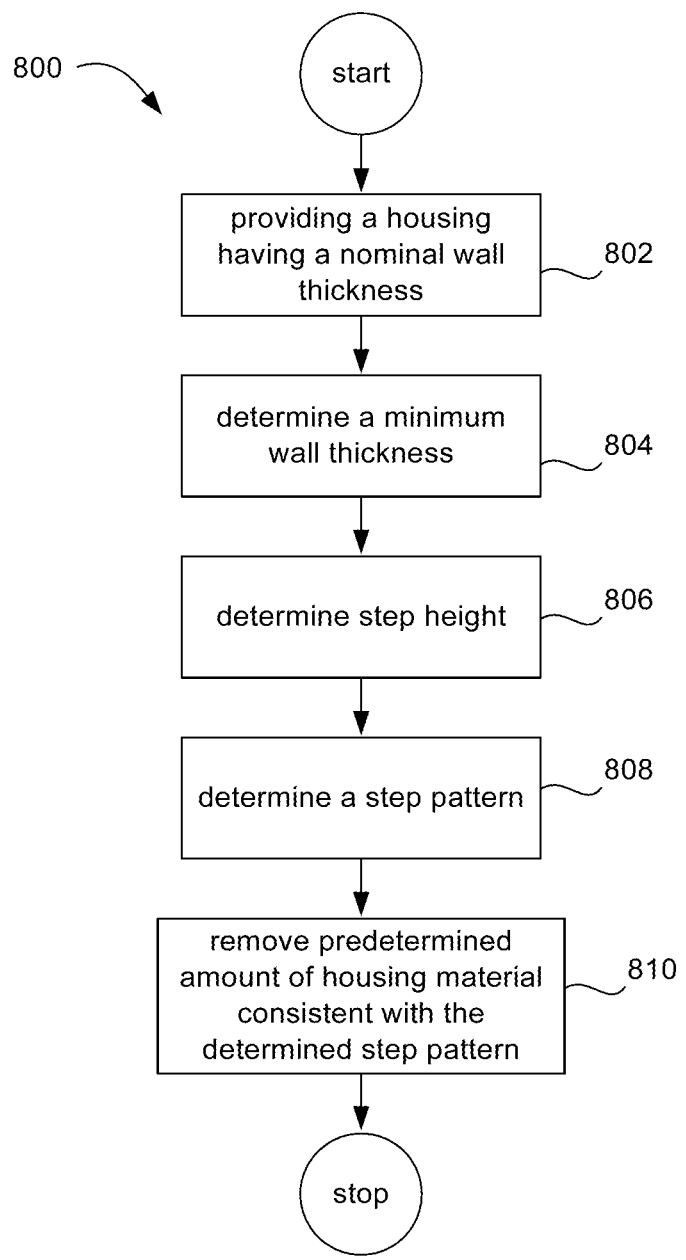
FIG. 8 shows a flow diagram describing a process for forming a plurality of steps in an interior surface of a housing in accordance with an embodiment of the invention.

FIG. 8 shows a flow diagram describing process 800 for forming a plurality of steps in an interior surface of a housing in accordance with an embodiment of the invention. Process 800 begins at 802 by providing a housing having a nominal wall thickness suitable for enclosing and supporting internal operational components for a portable computing device. At 804, a determination is made of a minimum wall thickness, the minimum wall thickness being a the least wall thickness value consistent with maintaining overall housing integrity. At 806, a determination is made of a step height. At 808, a step pattern is determined. In one embodiment, the step pattern can be that pattern of steps suitable for mounting a plurality of internal components to a bottom surface of the housing. In another embodiment, the step pattern consistent with an integrated beam structure can be determined. At 810, a predetermined amount of housing material consistent with the determined step pattern is removed from the bottom surface of the housing. In the described embodiment, the predetermined amount of housing material removed results in each of the steps having approximately equal step heights. In some cases, the resulting steps can have edges that are smoothed out in order to reduce the likelihood of damaging internal components. In the embodiment where an integrated beam structure is formed, then an amount of material that is less than the predetermined amount of housing material is removed from portions of the bottom surface of the housing that correspond to the internal beam structure. In some cases, essentially no housing material is removed from the bottom surface of the housing that corresponds to the integrated beam structure, whereas in other cases, the amount removed is less than the predetermined amount.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, optical data storage devices, and carrier waves. The computer readable medium can also be distributed over network-coupled computer systems so that the computer readable code is stored and executed in a distributed fashion.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

While the embodiments have been described in terms of several particular embodiments, there are alterations, permutations, and equivalents, which fall within the scope of these general concepts. It should also be noted that there are many alternative ways of implementing the methods and apparatuses of the present embodiments. For example, although an extrusion process is preferred method of manufacturing the integral tube, it should be noted that this is not a limitation and that other manufacturing methods can be used (e.g., injection molding). It is therefore intended that the following appended claims be interpreted as including all such alterations, permutations, and equivalents as fall within the true spirit and scope of the described embodiments.

What is claimed is:

1. A portable computing device, comprising: a single piece housing having a front opening, the single piece housing comprising: a bottom wall and side walls that cooperate to form a cavity in cooperation with the front opening, the bottom wall having a curved bottom surface, the side walls having rectilinear edges arranged such that they form a flat side surface an undercut within the cavity, an edge of the side walls surrounding and defining the front opening, wherein an interior surface of the bottom wall includes a plurality of mounting steps suitable for mounting an internal component thereon, a protective cover disposed within the front opening and attached directly to the single piece housing, the protective cover suitable for providing protection to a display device disposed within the single piece housing, a side opening disposed through one of the side walls and a corresponding portion of the bottom wall; a plurality of castellations protruding from the bottom wall and into the side opening; and a radio-transparent antenna window comprising a plurality of grooves, each groove for receiving a corresponding one of the plurality of castellations.

2. The portable computing device as recited in claim 1, further comprising: an integrated beam system integrally formed in the single piece housing, the integrated beam system used to provide support for the single piece housing by distributing a force applied at a point in the single piece housing evenly about the single piece housing, the integrated beam system comprising continuous and concentric loops of steps of housing material, the continuous and concentric steps located at predetermined locations on an interior surface of the single piece housing, formed the continuous and concentric steps being thicker than the plurality of mounting steps.

3. The portable computing device as recited in claim 1, wherein in a fully assembled state each of the plurality of castellations are inserted through an aperture of the corresponding one of the plurality of grooves, each castellation cooperating with an associated groove to form a cavity at least a portion of which is filled with adhesive, thereby adhesively coupling the castellation within the corresponding groove, and wherein an external surface of the radio-transparent antenna window provides a smooth exterior surface across the front opening and fits within the front opening to provide a flush outer surface for the portable computing device.

4. The portable computing device as recited in claim 3, wherein a gap between the exposed surface of the front opening and the radio-transparent antenna window allows for differing thermal expansion coefficients of the radio-transparent antenna window and the side walls to be compensated for during heat excursions of the electronic device.

5. The portable computing device as recited in claim 4, wherein the bottom wall and side walls are formed of metal and the radio-transparent antenna window is formed of plastic.

6. The portable computing device as recited in claim 5, wherein each of the castellations has a chamfered corner, the chamfered corner operative to ease insertion of the castellations through the aperture of each of the corresponding grooves.

7. The portable computing device as recited in claim 6, wherein the bottom wall has a curved exterior surface.

8. A portable electronic device, comprising: a processor; a radio-opaque housing having a front opening, the radio-opaque housing defining in part an outward appearance of the portable electronic device, the radio-opaque housing comprising: a bottom wall and side walls that cooperate to form a cavity in cooperation with the front opening, the bottom wall having a curved bottom surface, the side walls having rectilinear edges, an edge of the side walls surrounding and defining the front opening, wherein an interior surface of the bottom wall includes a plurality of mounting steps suitable for mounting an internal component thereon, an antenna window opening disposed through a portion of one of the side walls and a corresponding portion of the bottom wall, and a plurality of castellations protruding from the bottom wall that defines the antenna window opening, the castellations extending into the antenna window opening; a protective cover disposed within the front opening of the radio-opaque housing; and a radio-transparent antenna window comprising a plurality of grooves, each groove having a shape suitable for receiving a corresponding one of the plurality of castellations the radio-transparent antenna window disposed within the antenna window opening.

9. The portable electronic device as recited in claim 8, further comprising: an integrated beam system integrally formed in the radio-opaque housing, the integrated beam system used to provide support for the radio-opaque housing by distributing a force applied at a point in the radio-opaque housing evenly about the radio-opaque housing, the integrated beam system comprising continuous and concentric loops of steps of housing material, the continuous and concentric steps located at predetermined locations on an interior surface of the radio-opaque housing, formed the continuous and concentric steps being thicker than the plurality of mounting steps.

10. The portable electronic device as recited in claim 9, wherein the side walls have rectilinear edges arranged such that they form a flat side surface and an undercut within the cavity.

11. The portable electronic device as recited in claim 8, wherein the bottom wall and side walls are formed of metal and the radio-transparent antenna window is formed of plastic.

12. The portable electronic device as recited in claim 11, wherein the bottom wall and side walls are formed of an aluminum alloy.

13. The portable electronic device as recited in claim 8, wherein the plurality of castellations and grooves cooperate to secure the radio-transparent antenna window within the antenna window opening.

14. The portable electronic device as recited in claim 13, wherein each groove of the plurality of grooves comprises an aperture through which a corresponding castellation can be inserted, and a cavity within which a portion of the castellation can be captured.

15. The portable electronic device as recited in claim 14, wherein each groove of the plurality of grooves is configured to receive an amount of epoxy to secure at least a portion of the corresponding castellation within it.

16. The portable electronic device as recited in claim 14, wherein a distal end of each groove of the plurality of grooves is configured to interact with a lip portion of the aperture of the corresponding castellation to capture the antenna window within the antenna window opening prior to an adhesive being applied.

17. A portable electronic device, comprising:
a processor;
a radio-opaque housing having a front opening, the housing defining in part an outward appearance of the portable electronic device, the radio-opaque housing comprising:
  a radio opaque bottom wall and side walls that cooperate to form a cavity in cooperation with the front opening, the side walls having rectilinear edges, a top edge of the side walls surrounding and defining the front opening, and
  an antenna window opening disposed through a portion of one of the radio opaque side walls and a corresponding portion of the radio opaque bottom wall
  a radio-transparent antenna window disposed within the antenna window opening, wherein a first portion of the radio-transparent antenna window has a first curvature substantially the same as a curvature of a portion of the radio opaque bottom wall that defines a portion of the antenna window opening and wherein a second portion of the radio-transparent antenna window has a second curvature substantially the same as a curvature of a portion of the side wall that defines a portion of the antenna window opening; and
  a protective cover disposed within the front opening of the radio-opaque housing.

18. The portable electronic device as recited in claim 17, wherein one edge of the radio-transparent antenna window cooperates with a top edge of the side wall to define one of the top edges that define the front opening.

19. The portable electronic device as recited in claim 17, wherein the bottom wall and side walls are formed of an aluminum alloy.

20. The portable electronic device as recited in claim 18, wherein the protective cover overlays a touch sensitive display assembly.

* * * * *